(12) United States Patent
Akimoto

(10) Patent No.: US 7,158,212 B2
(45) Date of Patent: Jan. 2, 2007

(54) SCANNING EXPOSURE APPARATUS AND DEVICE MANUFACTURING METHOD

(75) Inventor: Satoshi Akimoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 216 days.

(21) Appl. No.: 10/968,046

(22) Filed: Oct. 20, 2004

(65) Prior Publication Data

US 2005/0083501 A1    Apr. 21, 2005

(30) Foreign Application Priority Data

Oct. 21, 2003    (JP)    ............................ 2003-361135

(51) Int. Cl.
*G03B 27/42* (2006.01)
*G03B 27/52* (2006.01)
*G03B 27/58* (2006.01)

(52) U.S. Cl. .............................. 355/53; 355/55; 355/72

(58) Field of Classification Search ................... 355/53, 355/55, 72

See application file for complete search history.

(56) References Cited

U.S. PATENT DOCUMENTS

| 5,917,580 | A | 6/1999 | Ebinuma et al. ............... 355/53 |
| 6,043,500 | A | 3/2000 | Akimoto ..................... 250/548 |
| 6,359,688 | B1 | 3/2002 | Akimoto et al. ............ 356/401 |
| 6,567,154 | B1 | 5/2003 | Akimoto ..................... 355/53 |

FOREIGN PATENT DOCUMENTS

JP    10-097987    4/1998

*Primary Examiner*—Peter B. Kim
(74) *Attorney, Agent, or Firm*—Fitzpatrick, Cella, Harper & Scinto

(57) ABSTRACT

A scanning exposure apparatus includes a projection optical system, a stage to move while holding a substrate, a measurement system to measure a position of the substrate in an optical axis direction of the projection optical system, a generation system to generate a driving signal, in which a change amount being controlled to be equal to or less than an upper limit value, to the stage based on the result of measurement by the measurement system, and a setting system to set the upper limit value based on a running status of the stage.

13 Claims, 8 Drawing Sheets

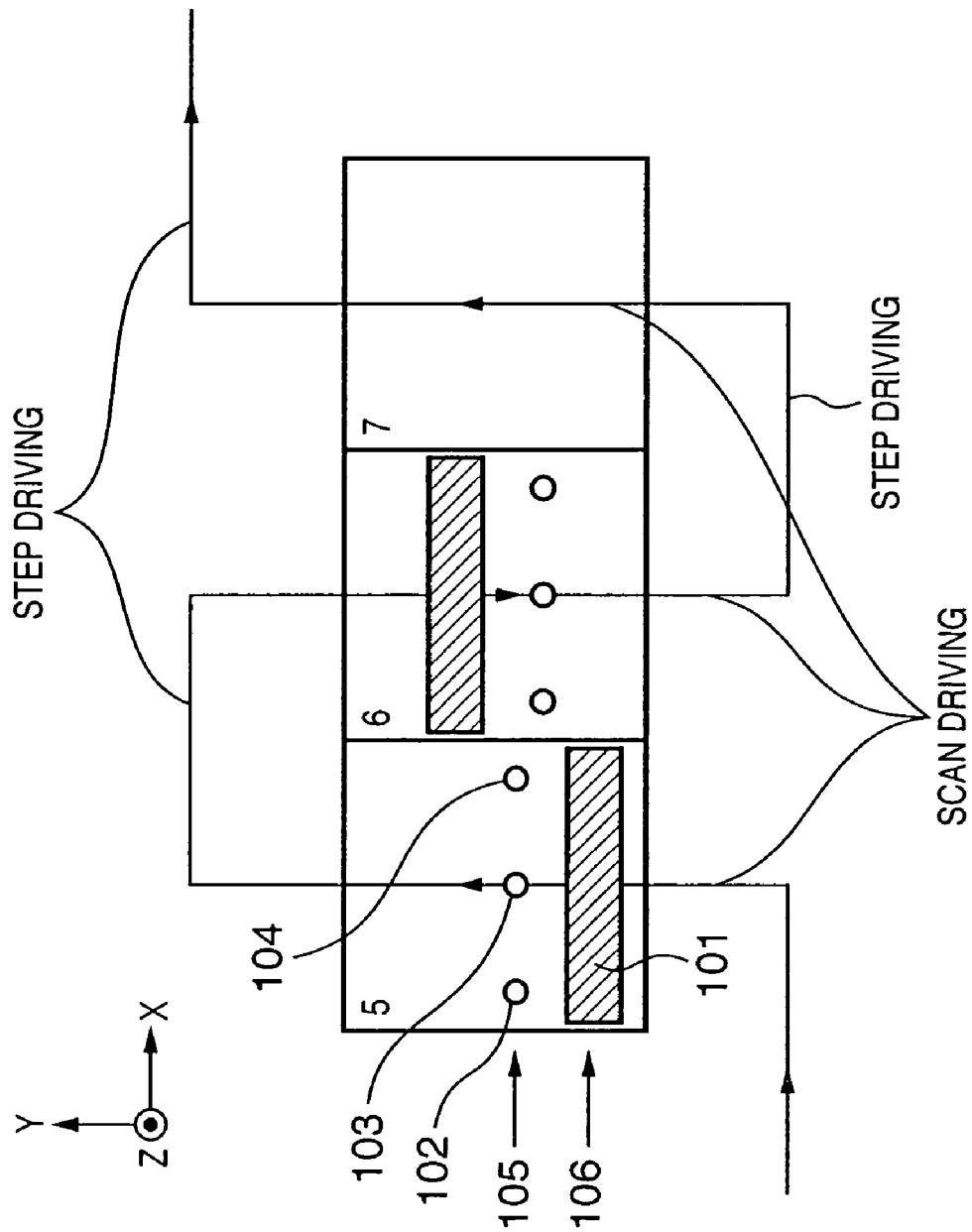

SCANNING EXPOSURE APPARATUS AND DEVICE MANUFACTURING METHOD

FIELD OF THE INVENTION

The present invention relates to a scanning exposure apparatus and method, and a device manufacturing method.

BACKGROUND OF THE INVENTION

An exposure apparatus to transfer a reticle fine pattern onto a wafer coated with a photosensitive material is employed in a photolithography process in semiconductor device manufacturing, or the like. In this sort of an exposure apparatus, a step-and-repeat method is mainly used for sequentially moving wafers into an exposure field of the exposure projection optical system and sequentially exposing the wafers to a reticle pattern.

In this step-and-repeat type projection exposure apparatus, to bring the exposure field on the wafer into correspondence with an image formation surface of the projection optical system, a focus/leveling sensor and a focus/leveling driving mechanism are provided. The focus driving is driving of a micromotion stage so as to bring a wafer surface position in an optical axis direction (z-axis direction) into correspondence with a focus position. Further, the leveling driving is detecting the inclination angle of the wafer surface and driving the micromotion stage to set the wafer surface in a horizontal position. The focus/leveling sensor measures a focus/leveling shift of the wafer, then the focus/leveling driving mechanism performs correction by the measured shift amount, and exposure is performed. In the case of a step-and-repeat method, as exposure is performed after the stoppage of a wafer, the amount of the focus/leveling driving does not influence the exposure accuracy.

On the other hand, there is an increasing need for expansion of a field of exposure area in accordance with upsizing of a semiconductor device in recent years. For this reason, a step-and-scan method meeting the requirement is increasingly employed. In the step-and-scan method, slit or circular-arc illumination light is emitted on a predetermined area of a reticle, then exposure is performed at a reduction ratio of a projection optical system in a slit lengthwise direction, while the reticle and the wafer are scanned in synchronization at the reduction ratio of a projection optical system in a widthwise direction of the slit.

In the step-and-scan method, a focus/leveling sensor and a focus/leveling driving mechanism are provided to bring the exposure field on the wafer into correspondence with the image formation surface of the projection optical system as in the case of the aforementioned step-and-repeat method. However, in the step-and-scan method, the slit (or circular-arc) exposure area on the wafer must be sequentially brought into correspondence with the image formation surface during scanning. For this purpose, in this method, a so-called look-ahead method is employed. The look-ahead method is measuring a focus/leveling shift by the focus/leveling sensor on the front side of the slit exposure area, i.e., on the front side in the scanning direction, and performing the focus/leveling driving based on the result of the measurement, thereby bringing the wafer surface in the measured point into the image formation surface of the projection optical system before the measured point comes to the slit exposure area (see, for example, Japanese Patent Application Laid-Open No. 10-097987).

In the look-ahead method, the amount of focus/leveling driving is calculated based on a discretely obtained measurement value. However, as a wafer has its own local distortion, a step portion due to suction by a wafer chuck to hold the wafer, a step portion caused by a foreign particle, or the like, in addition to a step portion caused by a formed pattern (process step), the driving amount calculated by the look-ahead operation is a large value in some cases. In such a case wherein steps different from the process step are to be followed, the following accuracy of focus/leveling is degraded, and further, the synchronization accuracy between the reticle and wafer is degraded. That is, in the step-and-scan method, different from the step-and-repeat method, as measurement and driving for focus/leveling are repeated during scanning, the amount of focus/leveling driving influences the exposure accuracy.

In the conventional art, a unique upper limit value is provided for the discretely obtained focus/leveling driving amount for improvement in the focus/leveling following accuracy and the synchronization accuracy. However, the focus/leveling following accuracy and the synchronization accuracy to the focus/leveling driving amount are low when the scanning speed or scan acceleration of the wafer stage is high, while the focus/leveling following accuracy and the synchronization accuracy are high when the scanning speed or scan acceleration of the wafer stage is low. In the above conventional art, the upper limit value to the focus/leveling driving amount is a unique value, and the upper limit value is adapted to a worst case wherein the scanning speed or scan acceleration is high. Accordingly, when the scanning speed or scan acceleration is low, the limit value is an excessive control value to the driving amount. For example, at a low scanning speed or scan acceleration, if the upper limit value of the focus/leveling driving amount is high, the following is possible and sufficient focus accuracy can be maintained regarding a wafer with large process steps. However, the above-described excessive control may hinder the focus/leveling following. As a result, the focus/leveling following accuracy may be degraded.

SUMMARY OF THE INVENTION

The present invention has been made in consideration of the above problems, and has its exemplified object to reduce a disadvantage due to excessive limitations of a change amount of focus or a leveling drive signal.

According to one aspect of the present invention, there is provided a scanning exposure apparatus comprising a projection optical system, a stage to hold a substrate and to move a measurement system to measure a position of the substrate in a direction of an optical axis of the projection optical system, a generation system to generate a driving signal for the stage based on a measurement result by the measurement system, the generation system generating the driving signal so that a change amount of the driving signal is limited to be not greater than an upper limit value, and a setting system to set the upper limit value based on a motion state of the stage.

Further, the present invention provides a device manufacturing method for manufacturing a device by using the above-described scanning exposure apparatus.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 3 is an explanatory view of a look-ahead method in the scanning projection exposure apparatus;

DETAILED DESCRIPTION OF THE PREFERRED EMBODIMENTS

Preferred embodiments of the present invention will now be described in detail in accordance with the accompanying drawings.

<First Embodiment>

Figure 1:
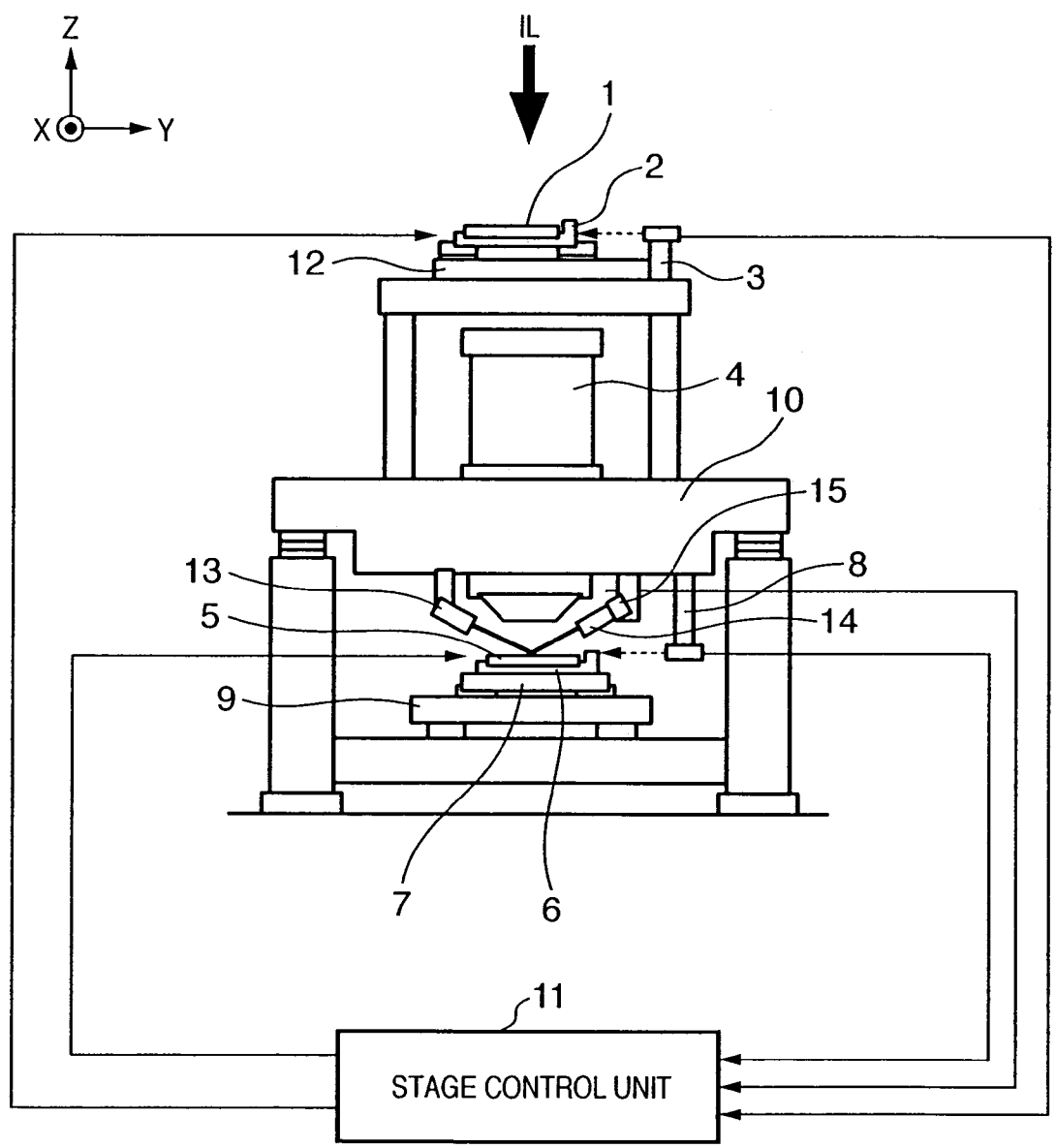
FIG. 1 is a schematic cross-sectional view showing the structure of a scanning projection exposure apparatus according to a first embodiment of the present invention.

FIG. 1 is a schematic cross-sectional view showing the structure of a step-and-scan type projection exposure apparatus (also referred to as a "scanning exposure apparatus") according to a first embodiment of the present invention. A reticle 1 having a circuit pattern is irradiated with slit illumination light IL having a uniform illumination intensity. The pattern on the reticle 1 is image-formation projected onto a wafer 5 for semiconductor device fabrication, in synchronization between reticle stage 2 and XY stage 7 at a reduction ratio of a projection lens 4 in an X direction (lengthwise direction) of the slit and at a speed of the reduction ratio of the projection lens 4 in a Y direction (widthwise direction). The position of the reticle stage 2 is measured by a laser interferometer for X measurement of a reticle stage (not shown), a laser interferometer 3 for Y measurement, and a laser interferometer for ωZ measurement (not shown), and is transmitted to a stage control unit 11.

On the other hand, the wafer 5 is placed on a micromotion stage 6, which is subjected to focus (z directional) driving, leveling (X-axial rotation ωX and Y-axial rotation ωY) driving, and rotational (Z-axial rotation ωZ) driving. The micromotion stage 6 is provided on the XY stage 7, which two-dimensionally moves in parallel in a horizontal plane (XY coordinate plane), and its position is measured by laser interferometers and transmitted to the stage control unit 11 as in the case of the reticle stage 2. Note that in FIG. 1, only a laser interferometer 8 for Y measurement is shown (herein below, the micromotion stage 6 and the XY stage 7 will be referred to as "wafer stages 6 and 7"). Reference numeral 9 denotes a stage platen to which the wafer stages 6 and 7 are fixed.

As the respective laser interferometers (3, 8, and the like), the projection lens 4, and a reticle stage platen 12 are fixed to a main body structure 10, and the reticle stage 2 and the wafer stages 6 and 7 can be position-controlled with reference to the main body structure 10. That is, the stage control unit 11 performs independent or synchronized control on the reticle stage 2 and the wafer stages 6 and 7, based on the position measured by the interferometers.

To bring the image formation surface of the projection lens 4 into correspondence with a slit exposure area surface of the wafer 5, an oblique incidence focus/leveling sensor (having elements 13 to 15) is provided. The sensor mainly has a light source (not shown), a projection objective lens 13, a photoreception objective lens 14 to input reflected light from the surface of the wafer 5, and a photoreception member (CCD) 15. The stage control unit 11 calculates a focus shift and/or a leveling shift of the slit exposure area surface of the wafer 5 based on the measurement values from the oblique incidence focus/leveling sensor (herein below, referred to as a "focus/leveling sensor 13–15"), and outputs a command value for focus/leveling driving to the micromotion stage 6. In the present embodiment, the stage control unit 11 generates a command value for focus/leveling shift correction, and further, adjusts the limit of the command value in correspondence with the driving status.

In the above-described step-and-scan projection exposure apparatus, the slit exposure area on the wafer must be sequentially brought into correspondence with the image formation surface during Y-directional scanning. To realize the correspondence, the look-ahead method is employed. In the look-ahead method, a focus/leveling shift of the wafer is measured by the focus/leveling sensor 13–15 on the front side of the slit exposure area, i.e., on the front side in the scanning direction, and the focus/leveling driving is performed based on the result of measurement, thereby, the wafer surface in the measured point is brought into the image formation surface of the projection optical system before the measured point comes to the slit exposure area.

Figure 2:
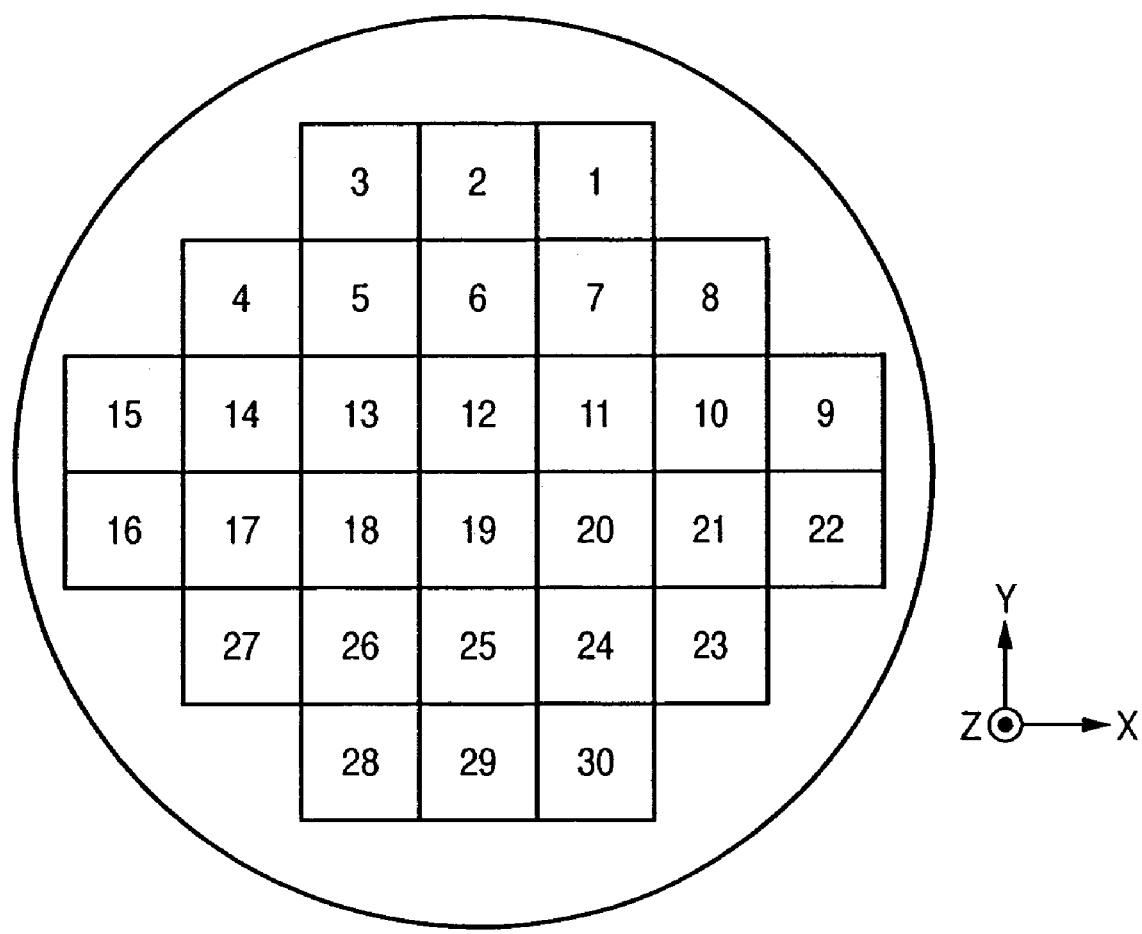
FIG. 2 is a schematic view showing an example of a wafer shot layout.

Next, the look-ahead method will be described with reference to FIG. 2, showing an example of a wafer shot layout when a wafer area is divided into thirty shots. In FIG. 2, numbers in the shots indicate the exposure order in the step-and-scan operation. FIG. 3 is an explanatory view showing the details of the step-and-scan in the 5th to 7th shots in FIG. 2. Actually, the wafer is moved to the slit exposure area by light projection by the projection lens for sequential exposure, however, in FIG. 3, for the sake of simplification of explanation, the slit exposure area scan-moves on the wafer.

Upon exposure on the shot 5, a slit exposure area 101 scan-moves in a +Y direction. Actually, the reticle stage 2 is scan-moved in the +Y direction while the wafer stages 6 and 7 are scan-moved in a –Y direction. On the other hand, the focus/leveling sensor 13–15, having three sensors 102 to 104 arrayed in the X direction, measures three point positions arrayed in the X direction in the Y-directional+position from the slit exposure area, thereby measuring a focus/leveling shift of an area preceding the slit exposure area. Note that the three sensors 102 to 104 actually measure a focus directional (Z directional) displacement. Assuming that measurement values from the sensors are $Z_{102}$, $Z_{103}$ and $Z_{104}$, focus (Z) shift $\Delta Fc$ and leveling (ωY) shift $\Delta Lv$ are obtained by the following expressions.

$$\Delta Fc = (Z_{102} + Z_{103} + Z_{104})/3 \quad (1)$$

$$\Delta Lv = (Z_{102} - Z_{104})/D \quad (2)$$

D: distance between the sensors 102 and 104 on the wafer.

In this manner, the focus shift ($\Delta Fc$) is obtained from a mean value of the three point measurement values, and the leveling shift ($\Delta Lv$) is obtained from a difference value between the two point measurement values ($Z_{102}$ and $Z_{104}$). The focus/leveling shift is measured always before the slit exposure area and transmitted to the stage control unit 11. The calculation of the shift amounts $\Delta Fc$ and $\Delta Lv$ is not limited to the expressions (1) and (2). Further, in the case of the shot 6, as the scan is performed in an inverted direction, the slit exposure area scan-moves in the $-Y$ direction. Accordingly, the focus/leveling sensor 13–15 performs a look-ahead measurement in an area ahead of the slit exposure area in the $-Y$ direction. Actually, one set of focus/leveling sensors may be provided for each respective scanning direction, and one of the sets of sensor may be selected in accordance with a scanning direction.

Next, the stage control unit 11 sequentially generates target trajectories to bring the slit exposure area into correspondence with the image formation surface of the projection lens 4 based on the focus/leveling shift measured and transmitted by the look-ahead measurement. The target trajectories generated by using the $\Delta Fc$ and $\Delta Lv$ values are $Fc(y)$ and $Lv(y)$. Alphabet "y" indicates a Y coordinate position (scanning direction) of the wafer stages 6 and 7. Further, "y" is a y function. These functions $Fc(y)$ and $Lv(y)$ may be arbitrary functions, such as quadratic functions or trigonometric functions.

Figure 4A:
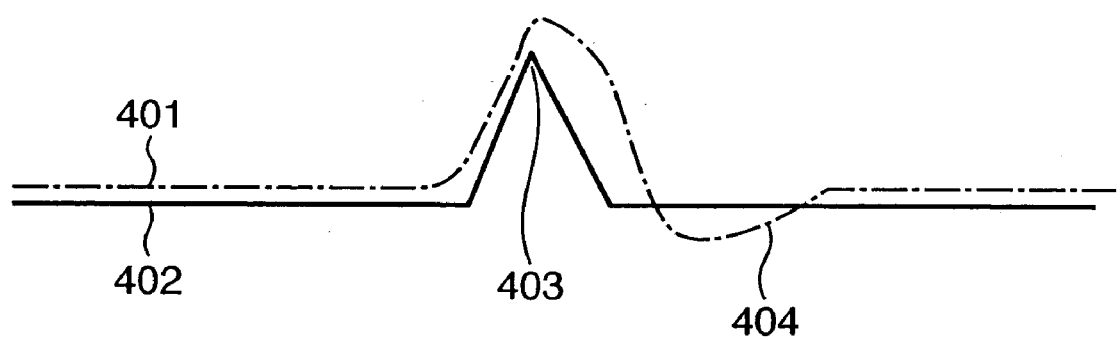
FIGS. 4A to 4C are explanatory views of a focus driving operation.
Figure 4B:
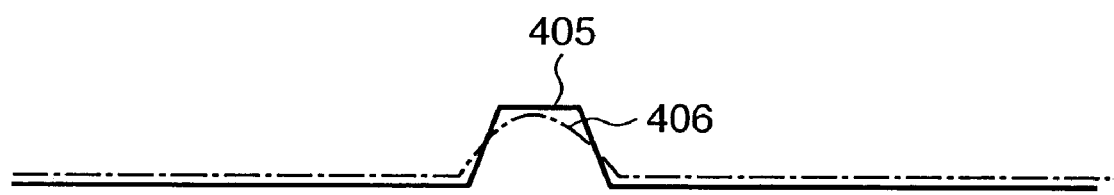

The functions $Fc(y)$ and $Lv(y)$ may locally include a great amount of changes due to local distortion of the wafer 5 itself, a suction step portion due to suction by a wafer chuck to hold the wafer 5, a step portion caused by a foreign particle, and the like. Accordingly, if the functions $Fc(y)$ and $Lv(y)$ are applied as command values, a driving signal to the micromotion stage 6 includes a large amount of a high frequency component. However, an upper limit is set in the following performance (following frequency) of the focus/leveling driving mechanism, and driving at a high frequency over the upper limit cannot be followed. In this status, local steps cannot be followed, and further, an exposure surface is greatly shifted from the image formation surface in the subsequent exposure area. FIGS. 4A and 4B show this problem. In these figures, the lateral axis indicates the y position of the wafer stages 6 and 7, and the vertical axis, the z position. A solid line 402 indicates the target trajectory $Fc(y)$. In this example, it has a triangular portion 403 around the middle. If this function $Fc(y)$ is applied as a target trajectory to the micromotion stage 6, an actual trajectory of the micromotion stage 6 is as indicated with a dotted line 401. Note that in FIGS. 4A to 4C, for eye-friendly illustration, the target trajectory (solid line) and the actual trajectory (dotted line) are slightly shifted from each other in the Z direction. It is understood from FIG. 4A that the leveling driving of the micromotion stage 6 cannot follow the triangular portion 403 when driving is made at a high frequency, and the influence of the portion continues to the subsequent portion (404).

Then, in the conventional art, the stage control unit 11 performs the following processing on the functions $Fc(y)$ and $Lv(y)$.

$$Fc(y)'=\text{LIMIT}(Fc(y)) \quad (3)$$

$$Lv(y)'=\text{LIMIT}(Lv(y)) \quad (4)$$

Note that "LIMIT(meas)" is a function to limit (set an upper limit value in) a measurement value "meas". For example, if the absolute value of the measurement value "meas" is less than "a (positive value)", the function value is the value of the "meas". If the absolute value is equal to or greater than "a", the function value is "a", and if the measurement value "meas" is equal to or less than "$-a$", the function value is "$-a$".

FIG. 4B shows the effect by the above limit. A solid line 405 indicates the limit-processed function $Fc(y)'$. If the function $Fc(y)'$ is applied as a target trajectory to the micromotion stage 6, an actual trajectory of the micromotion stage 6 by the leveling driving follows the function $Fc(y)'$ (solid line 405) without error, as indicated with a dotted line 406. In this case, the dotted line 406 cannot fully follow the peak of the triangular portion 403 as an actual shift, however, the following accuracy in the subsequent area is improved in comparison with the dotted line 404 in FIG. 4A. This effect appears in a case wherein continuous steps exist.

Note that, in the above example, the description has been made about the focus shift $Fc(y)$, however, similar advantages can be obtained regarding the leveling shift $Lv(y)$, and the synchronization accuracy between the reticle 1 and the wafer 5 can be improved. That is, when leveling driving ($\omega Y$) is performed, vibration may occur in the X direction and interfere with the X directional driving, however, as an upper limit value is set in the leveling driving, the X-directional vibration can be reduced and the X-directional synchronization accuracy can be improved.

Figure 4C:
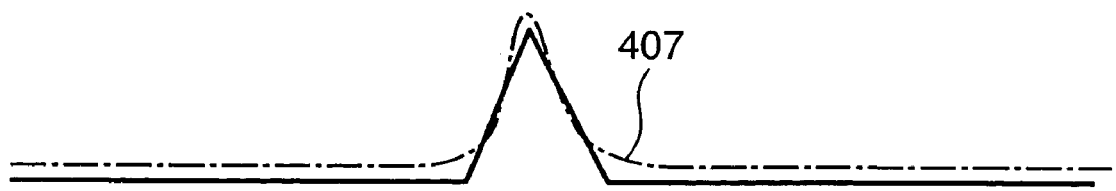

In the conventional art shown in FIGS. 4A to 4C, as the micromotion stage 6 cannot follow the step portion 403, advantages by the expressions (3) and (4) are obtained. However, when the scanning speed is low, as the driving frequency of the micromotion stage 6 to the step portion 403 is lower, the stage can follow a high frequency target trajectory, as indicated with the dotted line 407 in FIG. 4C. In a case wherein a step is caused not by a foreign particle, but by a wafer's local distortion, or the like, it is preferable that the stage can follow the step. However, in the above-described conventional art, the limit value is a constant value and adapted to a worst case wherein the scanning speed or scan acceleration is high. Accordingly, even in a case wherein the scanning speed is low and the stage can follow a target trajectory, as shown in FIG. 4C, a target trajectory as shown in FIG. 4B (405) is provided. This excessive limitation further degrades the following accuracy of focus/leveling driving.

To solve the conventional problems, in the first embodiment, the stage control unit 11 performs the following processing on the functions $Fc(y)$ and $Lv(y)$.

$$Fc(y)''=\text{LIMIT}(Fc(y),V\text{scan}) \quad (5)$$

$$Lv(y)''=\text{LIMIT}(Lv(y),V\text{scan}) \quad (6)$$

LIMIT (meas, Vscan): to limit measurement value meas in correspondence with scanning speed Vscan.

Figure 5:
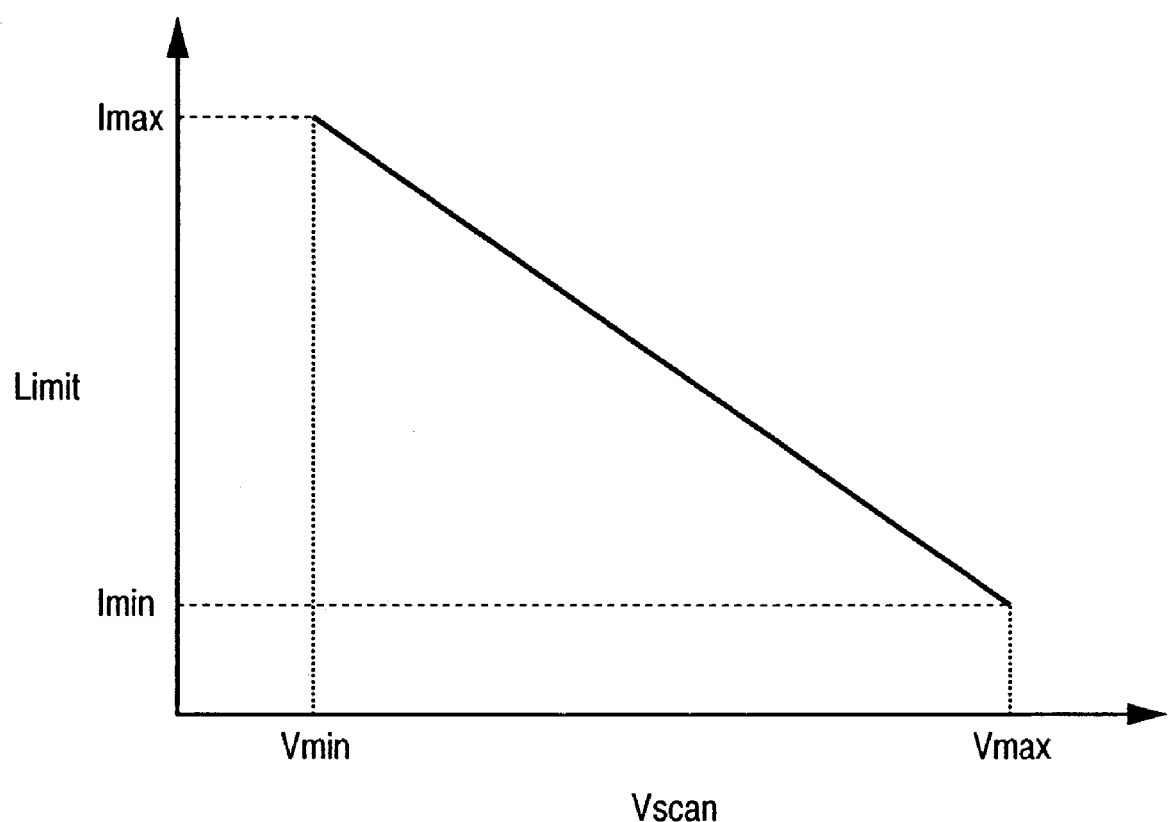
FIG. 5 is a graph showing an example of limit value setting in correspondence with a scanning speed.

FIG. 5 is a graph showing an example of limit value setting in correspondence with scanning speed. In the figure, the lateral axis indicates the scanning speed, and the vertical axis, the limit value. Regarding "LIMIT (meas, Vscan)" in the expressions (5) and (6), a smaller one of the limit value and the measurement value meas corresponding to the scanning speed Vscan is adopted as a value of the function shown in FIG. 5. Accordingly, when the scanning speed (Vscan) is higher, the limit value is smaller, and if the scanning speed is lower, the limit value is larger. This enables focus/leveling driving appropriate to the following performance of the micromotion stage 6, and the following performance of the focus/leveling driving can be improved.

Further, in a case wherein the limit value setting is performed in consideration of X-directional following performance (synchronization accuracy), the synchronization accuracy can be maintained without degradation. Regarding the synchronization accuracy, when the scanning speed is low, there is allowance (followable), but when the scanning speed is high, the accuracy is degraded (unfollowable). Accordingly, the setting is on-the-downside slope similar to that shown in FIG. 5.

Figure 7:
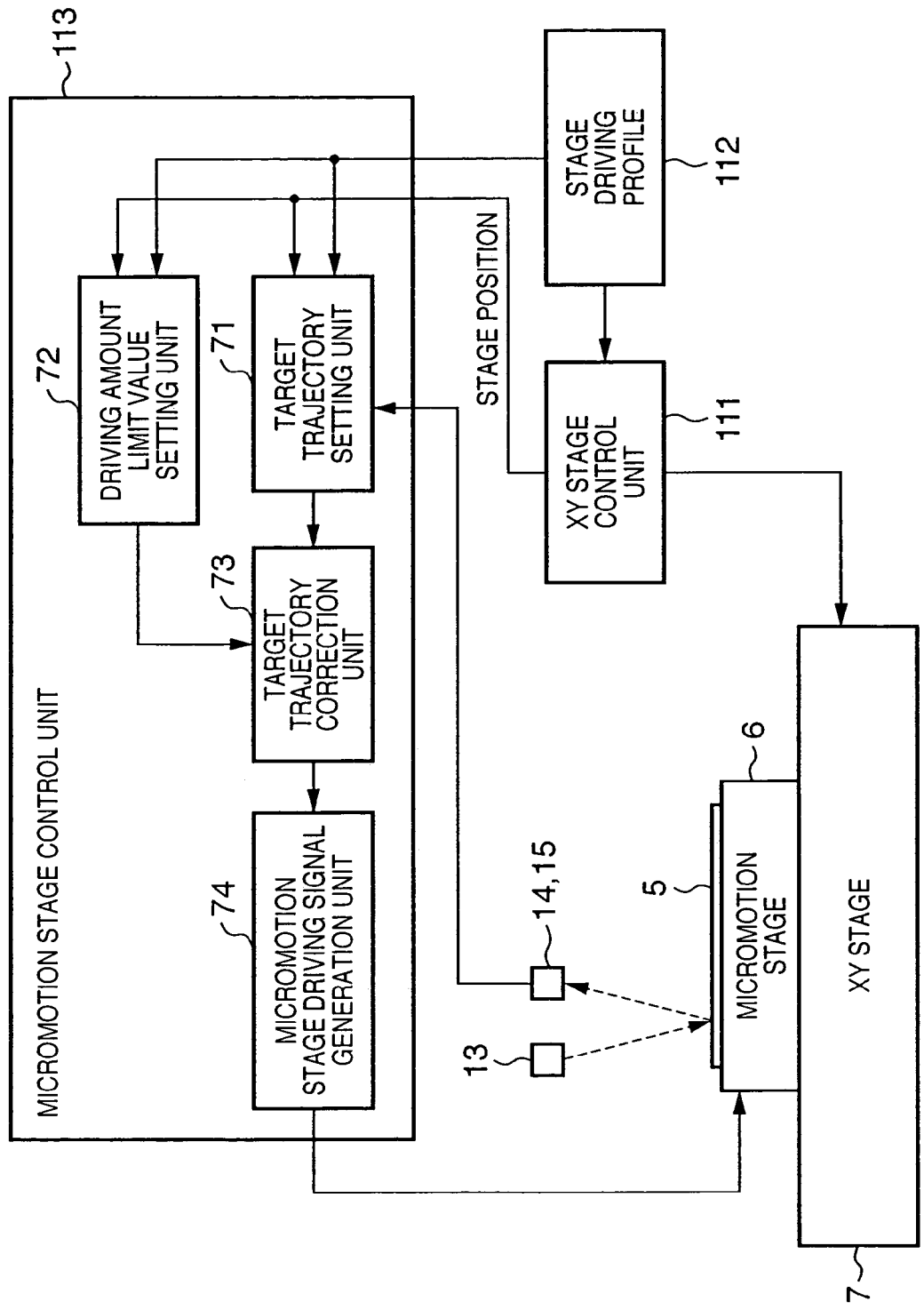
FIG. 7 is a block diagram for explaining stage control to realize focus/leveling driving according to the first embodiment.

FIG. 7 is a block diagram for explaining stage control to realize the above-described focus/leveling driving according to the first embodiment. The stage control unit 11 has an XY stage control unit 111 to drive-control an XY stage 7, a stage driving profile 112 in which driving conditions for the XY stage 7 are stored, and a micromotion stage control unit 113 to control driving of the micromotion stage 6. Note that the XY stage control unit 111 performs drive control by using a signal from a position detection system (e.g., the Y measurement laser interferometer 8) of the micromotion stage 6. However, the position detection system is omitted in FIG. 7.

In the micromotion stage control unit 113, a target trajectory setting unit 71 generates a target trajectory of the micromotion stage based on a stage position from the XY stage control unit 111 and signals from the focus/leveling sensor 13–15. For example, a target trajectory as indicated with the solid line 402 in FIG. 4A is generated. On the other hand, a driving amount limit value setting unit 72 obtains the speed of exposure scanning by the XY stage 7 from the stage driving profile 112, and obtains a limit value based on the obtained speed (e.g., the relation as shown in FIG. 5). A target trajectory correction unit 73 applies the limit value set by the driving amount limit value setting unit 72 to the target trajectory value set by the target trajectory setting unit 71, so as to cut a portion exceeding the limit value as shown in FIG. 4B, to generate a target trajectory to actually drive the micromotion stage 6.

A micromotion stage driving signal generation unit 74 performs focus/leveling driving on the micromotion stage 6 in accordance with the target trajectory finally obtained from the target trajectory generation unit 73.

In the first embodiment, the scanning speed is used as a parameter to determine the limit value, however, a stage driving profile such as scanning acceleration or jerk (acceleration change rate) may be used as a parameter. Note that in a case wherein the scanning speed, scanning acceleration or jerk changes in correspondence with stage position, the driving amount limit value setting unit 72 obtains a stage driving status (speed, acceleration, or the like) in a focus/leveling measurement position based on information from the stage driving profile 112 and a stage position obtained from the XY stage 111, and sets the limit value based on the obtained stage driving status.

Further, the calculation (processing) using the expressions (5) and (6), performed by the stage control unit 11, may be performed in a measurement unit (not shown) to output the results of measurement by the focus/leveling sensor 13–15.

Further, in the first embodiment, the leveling driving has been described with regard to the ωY driving, however, the driving may be similarly applied to the ωX driving.

<Second Embodiment>

In the first embodiment, the stage driving profile (speed, acceleration, jerk, or the like) is used as a parameter for determination of limit value. In the second embodiment, as a parameter as a reference for determination of limit value, the position of the XY stage 7 is used.

The micromotion stage 6 is subjected to leveling driving with a wafer center as a center of gravity. Accordingly, the interference by the ωY driving in the X directional and Z directional positions increases as an exposed shot becomes away from the wafer center in the X direction, and the interference by the ωX driving in the Y direction and Z direction increases as the exposed shot becomes away from the wafer center in the Y direction. That is, the synchronization accuracy and the focus accuracy are degraded in the wafer peripheral positions. In the second embodiment, the stage control unit 11 performs the following processing on the leveling driving amount Lv(y).

$$Lv(y)''' = \mathrm{LIMIT}(Lv(y), Wx, Wy) \qquad (7)$$

Figure 6:
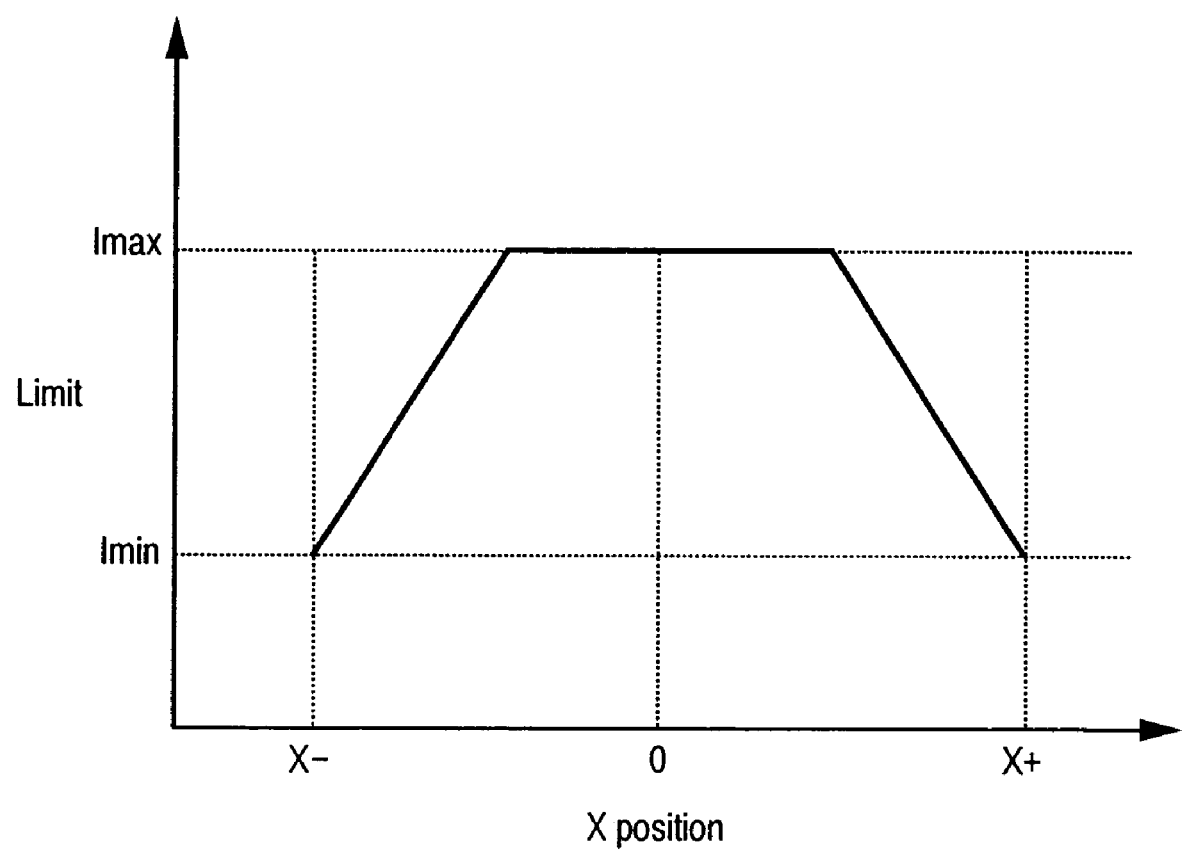
FIG. 6 is a graph showing an example of limit value setting in correspondence with a stage X position.

That is, the limit value of the leveling driving amount is set in correspondence with the X position and Y position of the wafer (XY stage 7). FIG. 6 shows an example of limit value setting in correspondence with an X position as a parameter. In the figure, the lateral axis indicates the X position, and the vertical axis, the limit value. The limit value is reduced as the position is around the wafer. By this arrangement, the synchronization accuracy and focus accuracy in the wafer peripheral positions can be improved. Regarding the Y position, similar limit value setting may be performed, and the synchronization accuracy and focus accuracy around the wafer can be improved.

Note that in the second embodiment, the limit value is set in correspondence with XY positions of the XY stage 7, however, the limit value may be set by each shot as shown in FIG. 2.

Further, the limit value may be set based on more parameters. Further, a table (array) storing limit values corresponding to respective parameter values may be used. Further, the limit value may be obtained by weighting and combining (adding or the like) limit values obtained from tables prepared for respective parameters.

Further, in the above-described first and second embodiments, a prepared limit value is employed. However, learning control may be realized based on the result of synchronization accuracy or focus/leveling accuracy. For example, it may be arranged such that a first measuring function of measuring focus/leveling accuracy based on a driving signal profile to the stage and actual stage driving trajectory, or a second measuring function of measuring synchronization accuracy between the reticle stage and the wafer stage, is additionally provided in the scanning exposure apparatus, and the limit value is learned based on the result of measurement by the first or second measuring function. Note that as an algorithm for the learning, a well-known algorithm such as a neural network may be utilized.

Further, in the first and second embodiments, the focus/leveling driving on the wafer stage side has been described. However, the present invention is applicable to a case wherein the focus/leveling sensor is provided on the reticle stage side and the focus/leveling driving is performed on the reticle stage.

Figure 8:
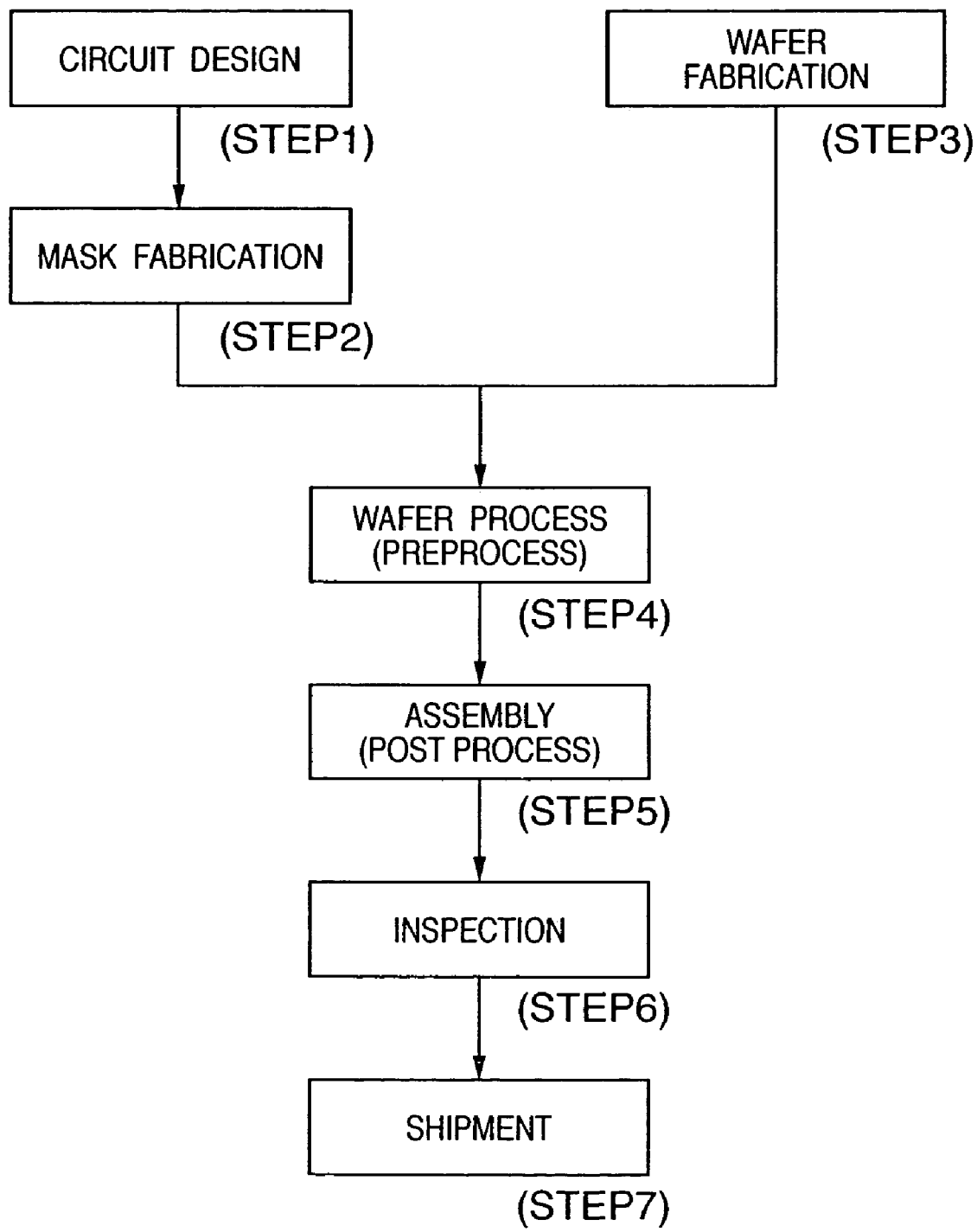
FIG. 8 is a flowchart showing a semiconductor device manufacturing process.

Next, a process of manufacturing a semiconductor device as an example of a microdevice by utilizing the above-described exposure apparatus will be described. FIG. 8 is a flowchart showing the flow of an entire semiconductor device fabrication process. At step 1 (circuit designing), a semiconductor device circuit pattern is designed. At step 2 (mask fabrication), a mask is fabricated based on the designed pattern.

On the other hand, at step 3 (wafer fabrication), a wafer is fabricated by using a material such as silicon. At step 4 (wafer process), called a preprocess, an actual circuit is formed on the wafer by a lithography technique using the above mask and wafer. At the next step 5 (assembly), called a post process, a semiconductor chip is fabricated by using the wafer carrying the circuit formed at step 4. Step 5 includes an assembly process (dicing and bonding), a packaging process (chip encapsulation), and the like. At step 6 (inspection), inspections such as an operation check, a durability test, and the like, are performed on the semiconductor device formed at step 5. The semiconductor device is completed through these processes, and is shipped (step 7).

The wafer process at the above step S4 has an oxidation step of oxidizing the surface of the wafer, a CVD step of forming an insulating film on the surface of the wafer, an electrode formation step of forming electrodes by vapor deposition on the wafer, an ion implantation step of injecting ions in the wafer, a resist processing step of coating the wafer with a photoresist, an exposure step of transferring the circuit pattern onto the wafer by the above-described exposure apparatus, a development step of developing the exposed wafer, an etching step of removing other portions than the developed resist, and a resist stripping step of removing the resist, which is unnecessary after the completion of etching. These steps are repeated, to form multiple layers of circuit patterns on the wafer.

As described above, according to the embodiments, as a limit value of a driving amount of focus driving and leveling driving is controlled in correspondence with a predetermined condition, the following accuracy and the synchronization accuracy of the focus/leveling driving can be improved.

According to the above construction, disadvantages due to excessive control of driving amount of the focus/leveling driving can be reduced.

As many apparently widely different embodiments of the present invention can be made without departing from the spirit and scope thereof, it is to be understood that the invention is not limited to the specific embodiments thereof except as defined in the appended claims.

CLAIM OF PRIORITY

This application claims priority from Japanese Patent Application No. 2003-361135 filed on Oct. 21, 2003, the entire contents of which are incorporated by reference herein.

What is claimed is:

1. A scanning exposure apparatus comprising:
   a projection optical system;
   a stage to hold a substrate and to move;
   a measurement system to measure a position of the substrate in a direction of an optical axis of said projection optical system;
   a generation system to generate a driving signal for said stage based on a measurement result by said measurement system, said generation system generating the driving signal so that a change amount of the driving signal is limited to be not greater than an upper limit value; and
   a setting system to set the upper limit value based on motion state of said stage.

2. An apparatus according to claim 1, wherein the substrate is one of an original plate and a substrate to be exposed.

3. An apparatus according to claim 1, wherein said generation system generates the driving signal for at least one of focus adjustment and leveling adjustment of the substrate.

4. An apparatus according to claim 1, wherein the motion state is at least one of velocity, acceleration, jerk and position.

5. An apparatus according to claim 1, wherein said setting system sets the upper limit value with respect to each exposure area on a substrate to be exposed.

6. An apparatus according to claim 1, wherein said setting system learns the upper limit value to be set.

7. A scanning exposure method using a projection optical system and a stage to hold a substrate and to move, said method comprising steps of:
   measuring a position of the substrate in a direction of an optical axis of the projection optical system while scanning the substrate with the stage;
   generating a driving signal for the stage based on a measurement result in said measurement step, the driving signal being generated so that a change amount of the driving signal is limited to be not greater than an upper limit value; and
   setting the upper limit value based on a motion state of the stage.

8. A method according to claim 7, wherein the substrate is one of an original plate and a substrate to be exposed.

9. A method according to claim 7, wherein in said generation step, the driving signal is generated for at least one of focus adjustment and leveling adjustment of the substrate.

10. A method according to claim 7, wherein the motion state is at least one of velocity, acceleration, jerk and position.

11. A method according to claim 7, wherein in said setting step, the upper limit value is set with respect to each exposure area on a substrate to be exposed.

12. A method according to claim 7, further comprising a step of learning the upper limit value to be set.

13. A device manufacturing method comprising steps of:
   exposing a first substrate to an image of a second substrate using a scanning exposure apparatus as recited in claim 1; and
   developing the exposed first substrate.

* * * * *